(12) United States Patent
Patwardhan et al.

(10) Patent No.: US 7,015,064 B1
(45) Date of Patent: Mar. 21, 2006

(54) MARKING WAFERS USING PIGMENTATION IN A MOUNTING TAPE

(75) Inventors: Viraj A. Patwardhan, Sunnyvale, CA (US); Nikhil Vishwanath Kelkar, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 127 days.

(21) Appl. No.: 10/830,818

(22) Filed: Apr. 23, 2004

(51) Int. Cl.
- H01L 21/50 (2006.01)
- H01L 21/48 (2006.01)
- H01L 21/44 (2006.01)

(52) U.S. Cl. ............ 438/106; 438/107; 438/108; 438/110

(58) Field of Classification Search ......... 438/745, 438/458, 460, 462, 464, 787, 107–108, 110
See application file for complete search history.

(56) References Cited

U.S. PATENT DOCUMENTS

| | | | |
|---|---|---|---|
| 4,442,137 A | 4/1984 | Kumar | |
| 5,316,853 A | 5/1994 | Shibata et al. | |
| 5,356,949 A | 10/1994 | Komiyama et al. | |
| 5,597,767 A | 1/1997 | Mignardi et al. | |
| 5,827,394 A | 10/1998 | Lu | |
| 5,923,995 A | 7/1999 | Kao et al. | |
| 5,960,260 A | 9/1999 | Umehara et al. | |
| 6,023,094 A | 2/2000 | Kao et al. | |
| 6,175,162 B1 | 1/2001 | Kao et al. | |
| 6,176,966 B1 | 1/2001 | Tsujimoto et al. | |
| 6,214,703 B1 | 4/2001 | Chen et al. | |
| 6,235,366 B1 | 5/2001 | Matsumoto et al. | |
| 6,319,754 B1 | 11/2001 | Wang et al. | |
| 6,383,833 B1 | 5/2002 | Silverbrook | |
| 6,398,892 B1 | 6/2002 | Noguchi et al. | |
| 6,444,310 B1 | 9/2002 | Senoo et al. | |
| 6,610,167 B1 | 8/2003 | Glenn et al. | |
| 6,623,594 B1 | 9/2003 | Yamamoto et al. | |
| 6,709,953 B1 | 3/2004 | Vasquez et al. | |
| 6,873,059 B1 | 3/2005 | Amagai et al. | |
| 2003/0143819 A1 | 7/2003 | Hedler et al. | |
| 2004/0104491 A1 * | 6/2004 | Connell et al. | 257/787 |
| 2004/0106233 A1 | 6/2004 | Lin et al. | |
| 2004/0161876 A1 * | 8/2004 | Tandy et al. | 438/106 |
| 2004/0191510 A1 | 9/2004 | Kiuchi et al. | |
| 2005/0070095 A1 | 3/2005 | Sharan et al. | |

FOREIGN PATENT DOCUMENTS

JP 54-131537 10/1979

* cited by examiner

Primary Examiner—Michael Lebentritt
(74) Attorney, Agent, or Firm—Beyer Weaver & Thomas, LLP

(57) ABSTRACT

Wafer level techniques for marking the back surfaces of integrated circuit devices are described. A wafer mounting tape is provided that includes releasable pigments. The pigments can be released by exposing the mounting tape to a selected frequency of electromagnetic radiation (e.g., UV light). The released pigments mark the back surface of the wafer. The exposure and pigmentation may be controlled using a variety of techniques including servo control of a light source, the use of masks or reticles or other suitable techniques. The marking may be done on any suitable back surface material including polymeric backcoatings, metalized films or directly on semiconductor materials.

7 Claims, 7 Drawing Sheets

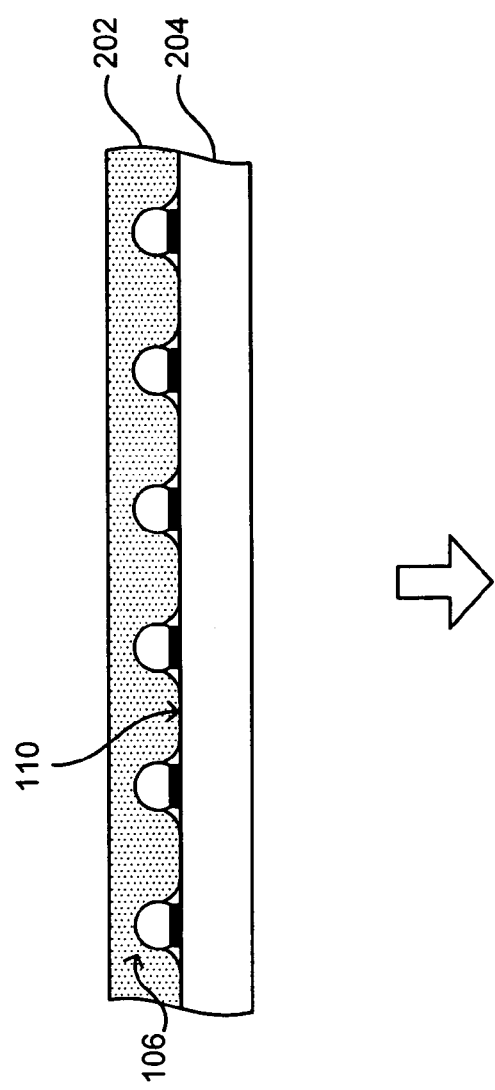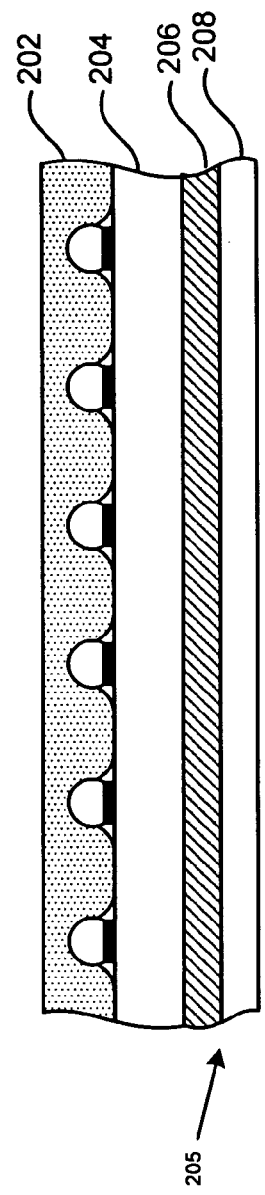

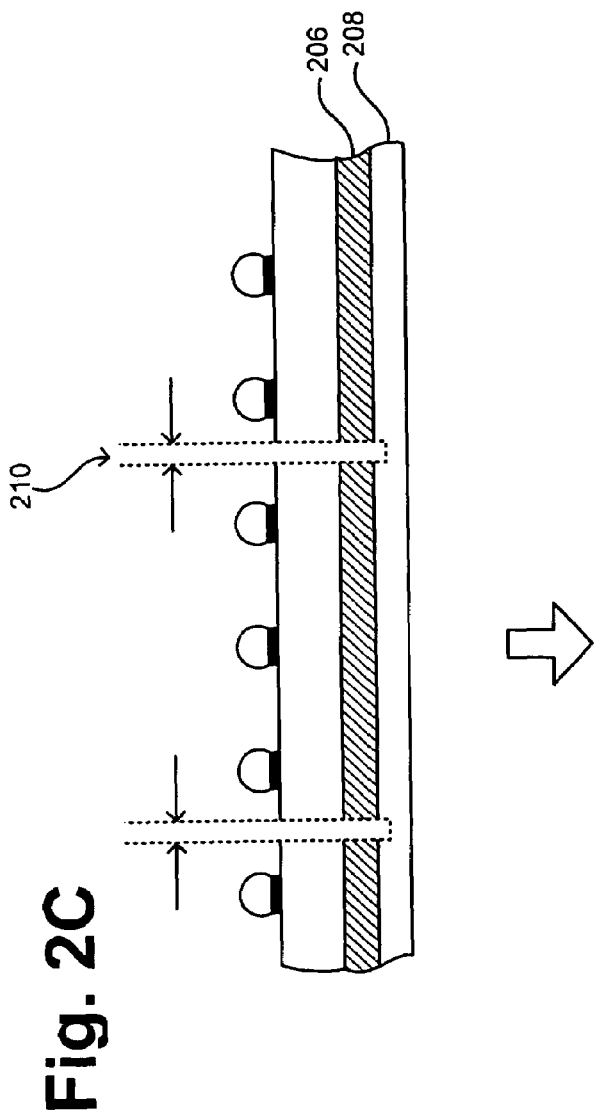
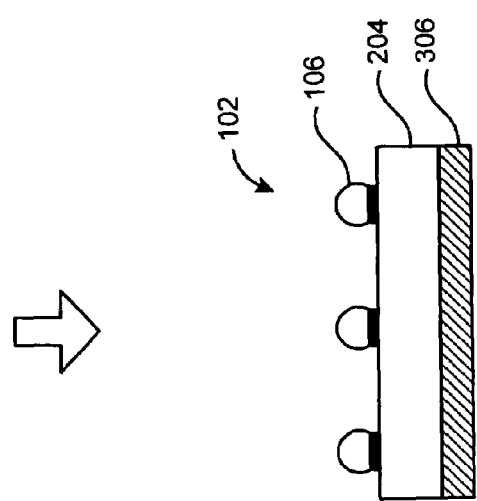

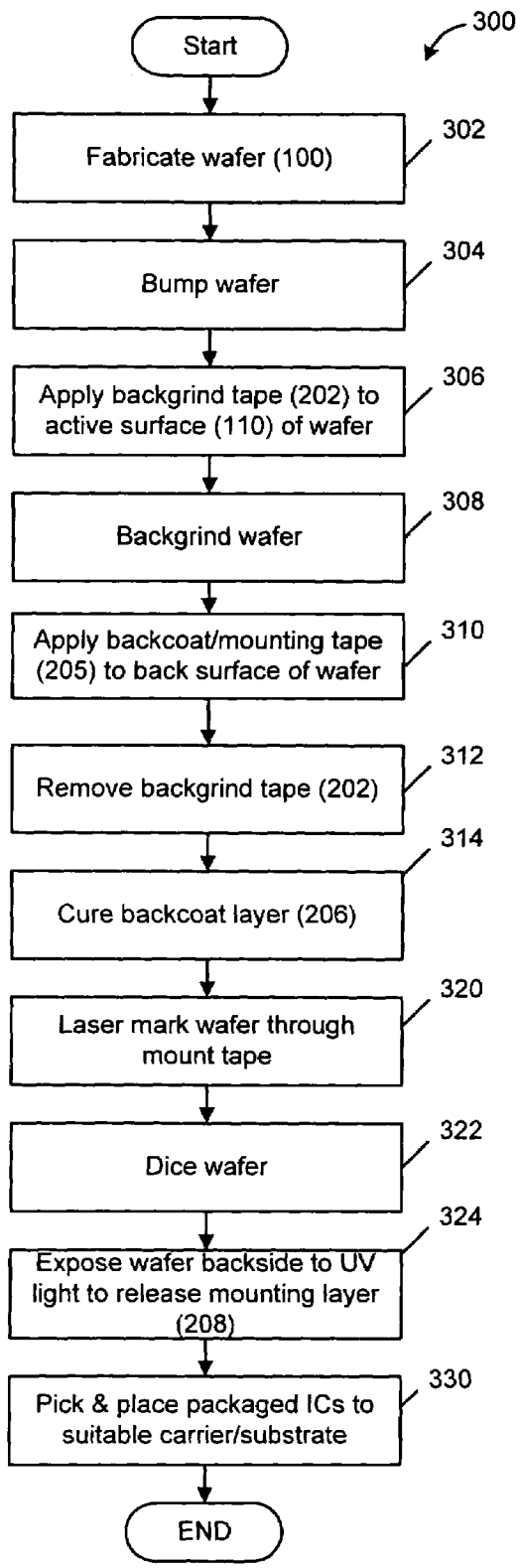

MARKING WAFERS USING PIGMENTATION IN A MOUNTING TAPE

FIELD OF THE INVENTION

The present invention relates generally to the packaging of integrated circuits. More particularly, the invention relates to wafer level arrangements and methods for marking the back surfaces of semiconductor dice.

BACKGROUND

There are a number of conventional processes for packaging integrated circuits. One approach that is commonly referred to as "flip chip" packaging generally contemplates forming solder bumps (or other suitable contacts) directly on the face of an integrated circuit die. In some situations, the contacts are formed directly on I/O pads formed on the die, whereas in other situations the contacts are redistributed. The die is then typically attached to a substrate such as a printed circuit board or package substrate such that the die contacts directly connect to corresponding contacts on the substrate.

In a number of packaging styles (including flip chip and other exposed die wafer level packaging styles) it is desirable to mark the back surface of the integrated circuit die/package. Depending upon the packaging contemplated, these markings may be made directly on a semiconductor material or on a back coating (e.g., polymeric protective coating). Typical marking may include designations such as an indication of the manufacturer or supplier of the devices, a part number, a "pin 1" designator, etc. To minimize costs, when possible, it is desirable to mark the devices at the wafer level.

In many applications the wafers are thinned (typically by backgrinding) in order to reduce the overall height of the resulting devices. As the desired thickness of semiconductor devices is reduced, it can become more difficult to perform the handling operations necessary to process (e.g. mark) the wafer after thinning. In the semiconductor industry, there are continuing efforts to increase device yield per wafer or lot and reduce the costs and time associated with semiconductor fabrication and packaging. The present invention seeks to provide more efficient approaches to marking the back surface of integrated circuits at the wafer level.

SUMMARY

To achieve the foregoing and other objects of the invention, wafer level methods of marking the back surfaces of integrated circuit devices are described. In one aspect, a wafer mounting tape is provided that includes releasable pigments. The wafer mounting tape may be used to support a wafer during wafer sawing and/or other process operation during the manufacture, packaging or testing of integrated circuits.

In some embodiments, the pigments used in the wafer mounting tape are arranged such that they can be released by exposing the mounting tape to a selected frequency of electromagnetic radiation (e.g., UV light). The released pigments mark the back surface of the wafer. The exposure and pigmentation may be controlled using a variety of techniques including servo control of a light source, the use of masks or reticles or other suitable techniques. The marking may be done on any suitable back surface material including polymeric backcoatings, metalized films and/or directly on semiconductor materials.

In some embodiments the mount tape can include a backcoat layer that is designed to permanently attach to the back surface of a wafer. In these embodiments, the pigment layer may be sandwiched between the backcoat layer and a mount layer so that any released pigments mark the back surface of the finished wafer (and more particularly, the back surface of the backcoat layer).

As will be appreciated by those familiar with the art, there are a variety of releasable pigment materials that may be used as the tape's pigment layer. By way of example, a variety of pigment releasable epoxy resins work well. The epoxy resins may be applied to the mounting tape in either film form or paste form. Emulsion based pigmentation approaches also work well.

BRIEF DESCRIPTION OF THE DRAWINGS

The invention, together with further objects and advantages thereof, may best be understood by reference to the following description taken in conjunction with the accompanying drawings in which:

FIGS. 2($a$)–2($d$) are diagrammatic cross sectional views of a wafer at various stages of production in accordance with an embodiment of the present invention.

FIG. 3 is a process flow diagram illustrating a method of packaging a die that facilitates applying a protective coating to the back surface of a wafer in accordance with one embodiment of the present invention.

In the drawings, like reference numerals generally designate like structural elements. Also, it should be understood that the depictions in the figures are not to scale.

DETAILED DESCRIPTION

The present invention relates generally to a wafer level method of applying a protective coating to the back surface of a wafer. Generally, a layered tape is adhered to the back surface of the wafer. In the illustrated embodiments, the tape, which is referred to herein as a backcoat/mount tape, includes a first layer formed from a "backcoat" material that will be permanently affixed to the back side of the wafer and a second "mounting" layer that effectively serves as a mounting tape suitable for supporting the wafer during dicing operations. The backcoating layer is generally formed from a material that can be set or cured such that it may be permanently secured to the back surface of the wafer. The mounting layer is arranged such that it is strongly adheres to the backcoating layer until it is "released", as for example, by UV irradiation. The described arrangement provides a good mechanism for applying an opaque protective coating layer to the back surface of a wafer.

Figure 1:
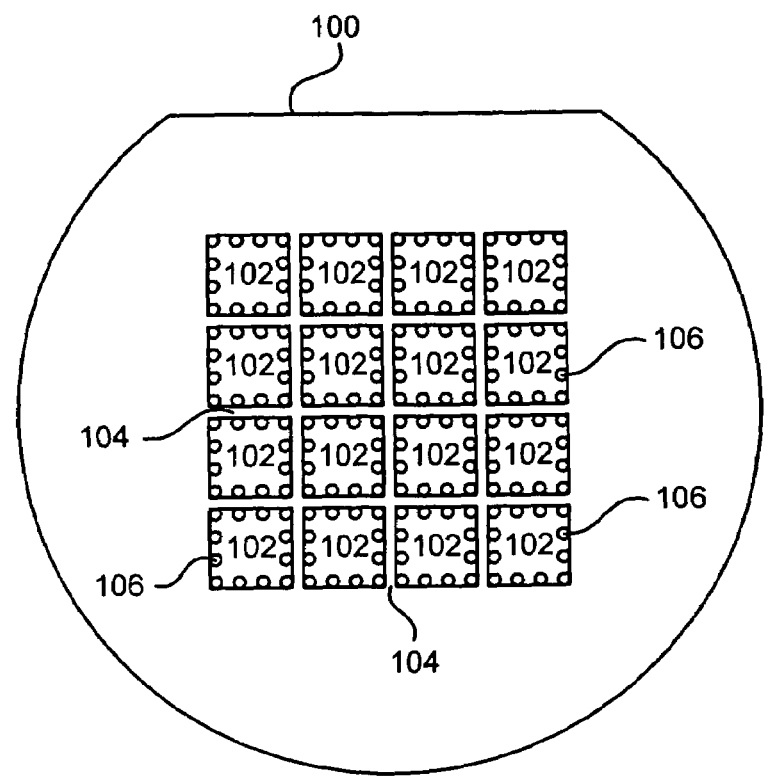
FIG. 1 illustrates in top plan view an exemplary wafer comprising multiple surface mount semiconductor dice.

Referring now to FIGS. 1–2 a representative method of applying a protective coating to the back surface of wafer 100 will be described. FIGS. 2(a)–2(d), are diagrammatic cross sectional views of a segment of a wafer at various stages in the process of applying a protective coating 206 to the back surface of a wafer 100 in accordance with an embodiment of the present invention. Initially, a wafer 100 is fabricated using conventional and/or appropriate wafer fabrication techniques. A representative wafer 100 is diagrammatically illustrated in FIG. 1. The illustrated wafer 100 has a plurality of dice 102 separated by horizontal and vertical scribe lines 104. Each of the dice 102 includes a plurality of solder balls, contacts or "bumps" 106 that are intended to be mounted directly onto contact pads of a substrate, such as a printed circuit board (PCB). The bumps 106 may be formed directly on I/O pads on the die or redistributed using conventional redistribution techniques. It should be noted that while only a relatively small number of dice 102 are shown on the wafer 100 for purposes of illustration, most wafers have significantly more dice formed thereon. By way of example, current state of the art wafers typically have several hundred to several thousand dice formed thereon, and some have more than ten thousand dice. As is well known in the art, most wafers and dice are formed of silicon, although any other appropriate semiconductor material can also be used, including, for example, gallium arsenide (GaAs), indium gallium phosphide, silicon germanium, and the like.

In many semiconductor applications it is considered desirable to reduce the height of the finished dice by "thinning" or backgrinding the wafer after fabrication. One conventional approach for thinning a wafer contemplates applying a backgrind tape 202 to the active (front) surface of the wafer 100 (step 306) and then grinding the back surface of the wafer (step 308) using conventional techniques to reduce the thickness of the wafer. The resultant thinned wafer is diagrammatically illustrated in FIG. 2(a). In the illustrated embodiment, the backgrind tape 202 covers both the solder bumps 106 and the active surface 110 of the wafer 100. The purpose of the backgrind tape is to stabilize the wafer during a backgrinding process. In this example, the backgrinding has all ready already been completed such that the wafer is at its intended thickness. It should be appreciated that wafer thinning is an entirely optional step, although it is relatively common in modern flip chip and wafer level packaging manufacturing processes.

Once the wafer is at its desired thickness, a backcoat/ mount tape 205 is applied to the back surface of the wafer 100 as illustrated In FIG. 2(b). The backcoat/mount tape 205 includes of a backcoat layer 206 and a mount layer 208. The backcoat layer 206 of the tape may serve several purposes. As an example, the backcoat layer 206 may be optically opaque to protect the IC from light exposure. This is particularly useful in applications where the die may be exposed after packaging. In some applications, the backcoat layer 206 may also help reduce chipping of the substrate 204 during a singulation operation. As such, the backcoat layer 206 may serve any of a number of functions. The mount layer 208 of tape 205 may also serve several functions including supporting the wafer during the testing/sorting of wafers (especially for very thin wafers), singulation as well as retaining the diced IC's for handling before picking.

In some embodiments, the backcoat layer 206 is formed from a curable adhesive such as an epoxy based adhesive material. As will be described in more detail below, in various embodiments, the backcoat layer 206 may be cured thermally, by UV irradiation or using other appropriate mechanisms. In other embodiments, the adhesive may be formed from a thermosetting composition or any other material that adheres well to the back surface of the wafer and is generally compatible with both the wafer and the intended use of the resulting semiconductor devices. What is important is that the backcoat layer adheres firmly to the back surface of the wafer so that it does not delaminate during subsequent fabrication steps or during use.

After the backcoat/mount tape has been applied, the backgrind tape 202 may be removed and the wafer 100 may be diced using any of a number of methods known in the art. By way of example, wafer sawing, laser cutting or other suitable singulation techniques may be used to dice the wafer. In the embodiment shown in FIG. 2(c), the singulation cut 210 is cut to a depth that fully divides the wafer substrate 204 and the backcoat layer 206 of the tape 205, but only partially cuts or scores the mounting portion 208 of the tape. In this manner, dicing proceeds until all of the IC devices have been singulated. The mounting portion 208 of the backcoat/mounting tape 205 assures that the IC devices are securely held in place as a group, which may be desirable to facilitate testing and/or further processing at the wafer level.

Once all of the desired processing has been accomplished, the mount layer of the backcoat/mount tape may be removed. As will be appreciated by those familiar with the art, many conventional wafer mount tapes are designed to be sensitive to UV light such that they originally adhere very strongly to the wafer, but they become substantially less sticky to the wafer after exposure to UV light. This property is particularly useful because the wafer mount tape adheres very strongly to the wafer during wafer processing (e.g. wafer sawing). Then, when wafer processing has been completed, the mount tape may be exposed to UV light, which effectively releases the tape by making the adhesive substantially less sticky. The exposed tape can then be readily removed from the back surface of the wafer. As discussed further below, in the illustrated embodiments, mounting layer 208 of the backcoat/mount tape 205 also preferably exhibits a releasing property such that when the mounting layer is "released", it may readily be separated from the backcoat layer which in turn is securely affixed to the dice 102. Although UV releasable tapes are most common in semiconductor applications, it should be appreciated that other suitable releasing mechanisms, such as thermally or chemically releasable tapes may be used as well.

Figure 5:
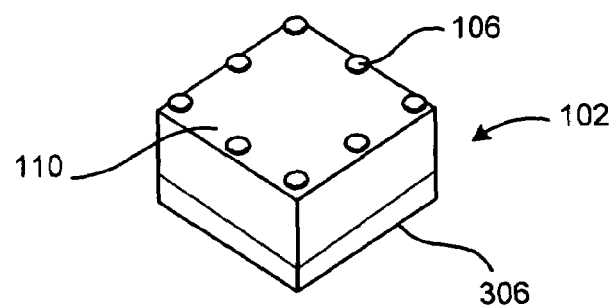
FIG. 5 illustrates in top perspective view a surface mount semiconductor die scribed from the wafer of FIG. 1.

After the mounting layer 208 of backcoat/mount tape has been released, the dice 102 may be picked from the mount tape (or the mount tape may be otherwise removed) thereby leaving a number of singulated dice. FIGS. 2(d) and 5 are diagrammatic cross sectional and perspective views of representative singulated dice 102 after the mount tape has been removed.

The described backcoat/mount tape can be used to efficiently, quickly and inexpensively apply a protective coating to the back surface of a wafer. The thickness of the resulting protective coating 306 depends in large part on the thickness of the backcoat layer 206 and therefore generally can be controlled by defining the thickness of the backcoat layer 206 in the backcoat/mount tape. The thickness of the backcoat layer and the resulting protective coating 306 may be widely varied based on the perceived needs of any particular situation. By way of example, protective coating thicknesses in the range of 5 to 50 microns are readily obtainable. Notably, protective coating films having a thickness of less than approximately 25 or 30 microns are readily obtainable. As will be appreciated by those familiar with applying protective coatings to the back surface of a wafer, these thicknesses are generally less than (potentially significantly less than) the thickness of screen or stencil printed protective coatings, which tend to be more in the range of 40 to 125 microns. In many current applications, coatings having thicknesses in ranges on the order 15 to 30 microns are desirable.

Since the described tape applied protective coatings can generally be thinner than screen and/or stencil printed coatings, they can be cured or set faster than printed coatings. This can be a significant advantage during production because it can take several hours (e.g. 8–10 hours) to apply and cure a printed protective back coating. Such a delay significantly slows the wafer production process. In contrast, the described tape applied protective layers can be applied and cured more quickly, which is a significant advantage.

Referring next to FIG. 3, a representative wafer finishing process that incorporates the present invention will be described. In this particular embodiment, the protective coating (backcoat layer) is thermally cured and the mounting layer is UV cured. Initially, a wafer is fabricated in a conventional manner in step 302. As noted above, a wafer will typically have several hundred to several thousand dice formed thereon, and some have more than twenty thousand dice. The wafer may then be bumped in operation 304. Bumping is a process by which solder balls of a selected size are formed in electrical connection with the wafer contacts. Bumping may be accomplished by any number of methods known in the art. After the wafer is bumped at operation 304, backgrind tape 202 may be applied to the active surface 110 of the wafer 100 at operation 306. The backgrind tape allows the wafer to be held firmly in place during a backgrind operation. Backgrinding allows the wafer to be brought into conformance with a desired thickness. It should be appreciated that as the size of electronic devices shrinks, so too must the attendant components of those devices. Backgrinding may be accomplished by any of a number of methods known in the art.

After backgrinding, a backcoat/mounting tape 205 is applied to the back surface of the wafer 100 at operation 310. Generally, the backcoat layer 206 is directly adhered to the back surface of the wafer that has been background as in operation 308. However, it can also be appreciated that backgrinding is not an absolutely necessary operation as the wafer may be in conformance to a desired thickness without backgrinding. Once the backcoat/mounting tape 205 is secured to the wafer, the backgrind tape 202 may be removed at operation 312. The removal of the backgrind tape 202 from the active surface of the wafer 110 exposes the solder balls 106 and therefore allows for probing of the wafer 100 as well as any other subsequent manufacturing processes and/or operations.

After the backgrind tape 202 is removed, the backcoat layer 206 may be cured at step 314. Curing the backcoat layer 206 completes its adhesion to the back surface of the wafer 100. That is, curing the backcoat layer 206 securely and permanently bonds the backcoat layer 206 with the wafer 100. Curing may be accomplished in multiple ways depending on the nature and type of backcoat material used as well as on the composition and characteristics of the wafer. In the illustrated example, the backcoat layer is thermally cured.

It should be appreciated that if the backgrind tape 202 is removed before curing as described above, then the uncured backcoat layer 206 of the backcoat/mounting tape 205 should adhere more strongly to the wafer than the backgrind tape 202 since otherwise, removal of the backgrind tape 202 will tend to separate the wafer from the backcoat/mounting tape 205. In alternative embodiments, the backgrind tape 202 can be removed after backcoat layer has been cured. In still other embodiments, the backgrind tape 202 can be removed before the backcoat/mounting tape 205 is applied.

In the described embodiment, the mount layer 208 is formed from a substantially clear or transparent UV curable adhesive material such as a suitable epoxy based or polymeric composition. With a clear mount layer 208, the back surface of the wafer 100 may be laser marked at operation 320 with the mount tape still in place by shining the laser through the mount layer. In this manner, laser marking may be done at the wafer level. It should be appreciated that the marking is done on the cured backcoat layer 206 through the clear mount layer 208. Laser marking is generally well known in the art and allows for a high degree of accuracy. However, as will be appreciated by those familiar in the art, laser marking is not traditionally done through a mount tape. As will be described in more detail below, marking through the mount tape has several advantages. Even in embodiments where the mount tape is not substantially transparent to the laser, the back surface of the wafer may still be marked with the backcoat/mount tape in place by burning through (or charring or partially burning through) the mount layer.

After the wafer 100 is marked at operation 320, the wafer 100 may then be diced or singulated at operation 322. Dicing is the process of separating IC devices residing on a wafer. The size of individual devices is variable and depends on the configuration requirements of the manufacturer. Dicing may be accomplished in any of a number of suitable manners including sawing or laser cutting. As can be seen in reference to FIG. 2(c), the singulation cut 210 fully separates both the device and the backcoat layer 206. However, the cut preferably does not fully cut through the mounting layer 208. In this manner, the individual devices, which are typically quite small, are held in place by the mounting layer. The devices may then readily be tested or further processed at the wafer level as desired for a particular device.

After the wafer 100 is diced at operation 322 and any other desired wafer level processing or testing is completed, the mounting layer 208 may then be released by exposure to UV light at operation 324. As will be appreciated by those familiar with UV releasable epoxies, exposing the mounting layer 208 to UV light significantly reduces the adhesive properties of that layer so that the individual devices 102 may be removed from the mounting layer 208 while allowing the backcoat layer 206 to stay on the backside of the singulated ICs. Once the mounting layer has been released, the individual devices 102 may be picked and placed as desired.

A representative individual semiconductor die 102 scribed from the wafer is shown in top perspective view in FIG. 5. Each die 102 preferably has a plurality of solder bumps 106 formed on an active face 110. It should be appreciated that although only one "row" or "ring" of solder contacts or bumps is provided on the die in the illustrated embodiment, other contact patterns including, for example, multiple rows, multiple rings, or arrays of contacts may also be provided as desired.

The backcoat/mounting tape 205 may be formed in any suitable manner. By way of example, the backcoat layer may be applied in either paste or film form to a conventional mount tape.

Figure 4:
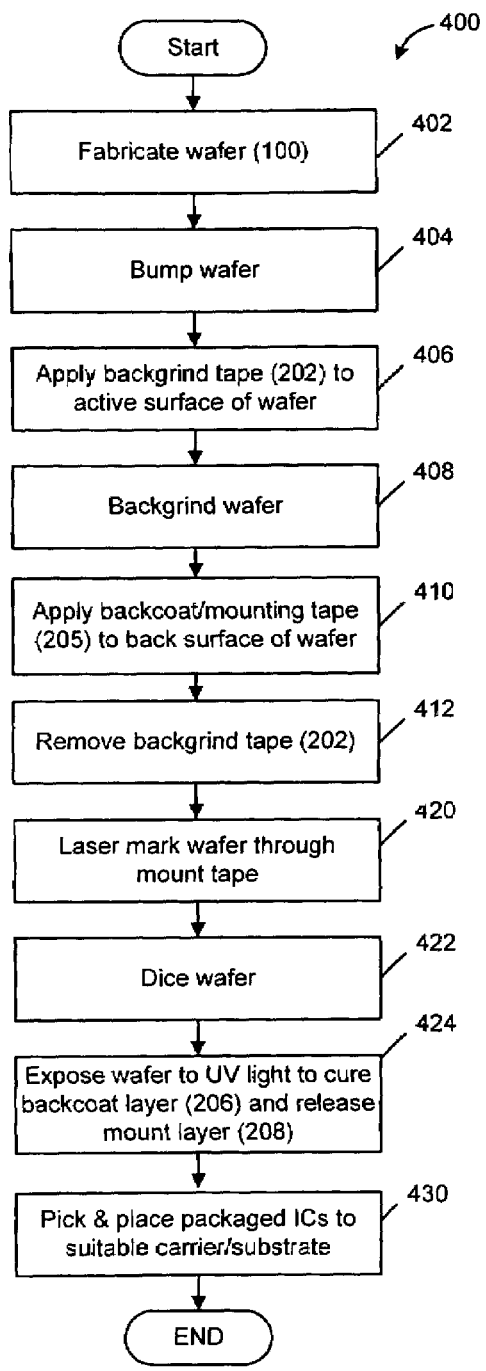
FIG. 4 is a process flow diagram illustrating a method of packaging a die that facilitates applying a protective coating to the back surface of a wafer in accordance with another embodiment of the present invention.

Referring next to FIG. 4, an alternative method of applying the backcoat layer will be described. This embodiment is somewhat similar to the embodiment described above with respect to FIG. 3. However, the backcoat layer 206 is formed of a UV curable material (such as a UV curable epoxy) and the mount layer 208 is formed from a clear UV releasable material (such as a UV releasable epoxy). With this arrangement, both the curing of the backcoat layer and the releasing of the mount layer may be accomplished in the same operation. As in the previously described embodiment, the backcoat layer may be applied to the mounting tape in either film form or paste form.

In this embodiment, the wafer may be fabricated and then bumped and/or background as desired in a manner similar to previously described. Thereafter, the backcoat/mounting tape 205 is applied to the back surface of the wafer in step 410. In this embodiment, the backgrind tape will be removed and the wafer will be diced prior to the curing of the backcoating layer. Therefore it is important that the backcoat layer adhere quite well to the wafer even prior to curing so that the removal of the backgrind tape does not pull the backcoat/mount tape 205 from the wafer and the wafer is held solidly in place during the dicing operation.

Once the backcoat/mounting tape 205 has been applied, the backgrind tape 202 may then be removed in operation 412 and the wafer may be laser marked in operation 420. Again, it should be appreciated that the order of these steps may be readily reversed. For example, it may be desirable to remove the backgrind tape 202 prior to the application of the backcoat/mount tape.

Once the wafer has been marked and the backgrind tape removed, the wafer may be diced in operation 422. Like in the previously described embodiment, the dicing cuts entirely through the wafer and the backcoat layer of tape 205, but only scores or partially cuts through the mounting layer of tape 205. After the wafer has been diced, it may be exposed to UV light in operation 424 to both finally cure the backcoat layer and release the mounting layer. The dice may then be picked and placed as desired.

In some embodiments, a single UV exposure can be used to both cure the backcoat layer and release the mounting layer as illustrated with respect to FIG. 4. However, it is often preferable to utilize a two-stage UV exposure wherein the dosage of the first exposure is arranged to cure the backcoat layer and the second exposure is arranged to release the backcoat layer. This can be accomplished by using materials that are activated by different frequencies of UV light or by controlling the dosage levels. In embodiments where a two-stage UV exposure is used, the process flow may be more similar to the flow described above with respect to FIG. 4 except that the first stage of the UV exposure (curing the backcoat layer) is done at step 314 before the wafer is diced. This is advantageous in many situations to insure that the backcoat layer adheres strongly to the wafer during the singulation process, particularly if wafer sawing is used to dice the wafer.

Figure 6:
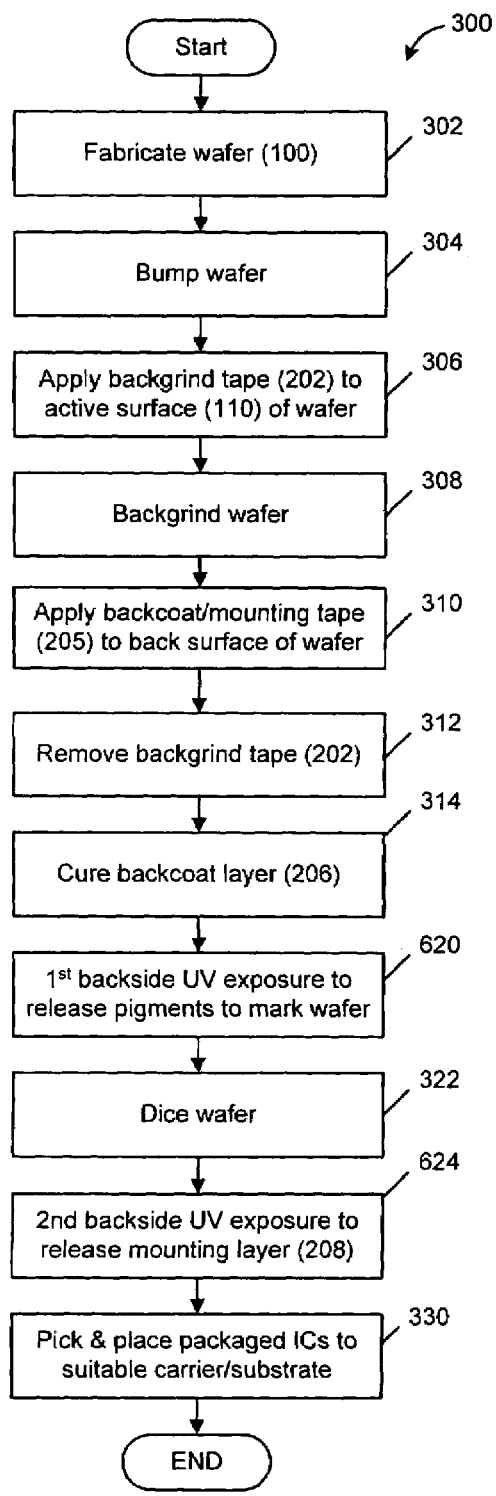
FIG. 6 is a process flow diagram illustrating a method of packaging a die that facilitates marking the back surface of a wafer in accordance with another embodiment of the present invention.

In the previously described embodiments, a two layered backcoat/mounting tape 205 has been used. In other embodiments additional layers may be provided in the backcoat/mounting tape. By way of example, the use of a specific three layer tape will be described with respect to FIG. 6. As in the previously described tapes, the upper layer is a backcoat layer and the lower layer is a transparent mount layer. The middle layer is a pigment layer that may be selectively activated to mark the back surface of the wafer (and more particularly, the back surface of the backcoat layer). As will be appreciated by those familiar with the art, there are a variety of releasable pigment materials that may be used as the tape's pigment layer. In the described embodiment, the pigment layer is formed from a releasable pigment material that may be released by exposure to UV light. By way of example, a variety of known pigment releasable epoxy resins may be used. The epoxy resins may be applied to the mounting tape in either film form or paste form. By way of example, suitable releasable pigment epoxy resins are available from Dexter Hysol, Loctite, Ablestik and/or Advantge Epoxy Composites. Alternatively, emulsion based pigmentation approaches may be used as well.

From a process standpoint, a manufacturing process using a backcoat tape with a pigment layer may be very similar to the processes described above with respect to FIG. 4 or 5. In the embodiment illustrated in FIG. 6, a packaging process flow similar to the flow described above with respect to FIG. 3 is illustrated. However, instead of laser marking the backcoat layer (e.g., step 320 of FIG. 3), when it is time to mark the wafer, the desired pigmentation is activated. The activation of the pigment may be accomplished using servo control of a laser or through the use of a mask or reticle that is positioned over the wafer. The mask/reticle is patterned with a positive image of the desired marking. As will be appreciated by those skilled in the art, it is common to mark the wafer with part numbers, trademarks, pin markings (e.g. pin 1 markings) and/or other appropriate designation information. With the mask or reticle in place, the back surface of the wafer (or a selected segment thereof) is exposed to UV light at a frequency that causes the exposed portions of the pigment layer to release. (Step 620). It should be appreciated that the mount layer of the tape is substantially transparent (at least to the wavelengths of light used to release the pigment layer). Therefore, the UV light passing through the mask can readily pass through the mount layer of the tape in order to release the pigments. The release of the pigment marks the adjacent portions of the backcoat layer, which causes the back surface of the wafer to be marked in a manner that matches the mask. In this way, the wafer can be marked in any way desirable. A variety of pigments may be used. By way of example, green and white pigments work well. In alternative embodiments, the marking may be done without the use of a mask or reticle using servo control of a laser or other appropriately constrained light source.

After the wafer has been marked, the wafer may be sorted, tested, diced, and/or otherwise processed in accordance with the needs of a particular application. When appropriate, the mount layer may be released as previously described. Preferably, the pigment releasing mechanism is designed to activate at a different frequency than the mount tape releasing mechanism. This prevents the pigment from being released during the mount tape exposure, which could cause pigment to cover the entire back surface of the wafer. Conversely, although it is preferable, it is generally not as important to insure that the mount tape does not release during the pigment releasing exposure. This is because most marking operations are designed to mark a relatively small percentage of the back surface of each die (and thus a relatively small percentage of the back surface of the wafer). Therefore, given the strength of the bond of the mount tape, even if the marked portion of the wafer is released, the mount tape will still be able to hold the wafer (dice) firmly in place during wafer sawing.

In the illustrated embodiment, the pigmentation is applied to a polymeric backcoat layer that is part of the mounting tape. However, it should be appreciated that the advantages of the use of pigmentation are not limited to use with mounting tapes that include a backcoat layer. Rather, a pigmentation layer may be used as part of any mounting tape. In these embodiments, the marking may be applied to any back surface of a wafer. Thus, by way of example, the pigmentation may be applied to the bare back surface of a wafer (i.e., directly on a semiconductor material), to a polymeric backcoating applied using other techniques, to a metalized back surface of a wafer, or any other coating that constitutes the back surface of a wafer.

Figure 7:
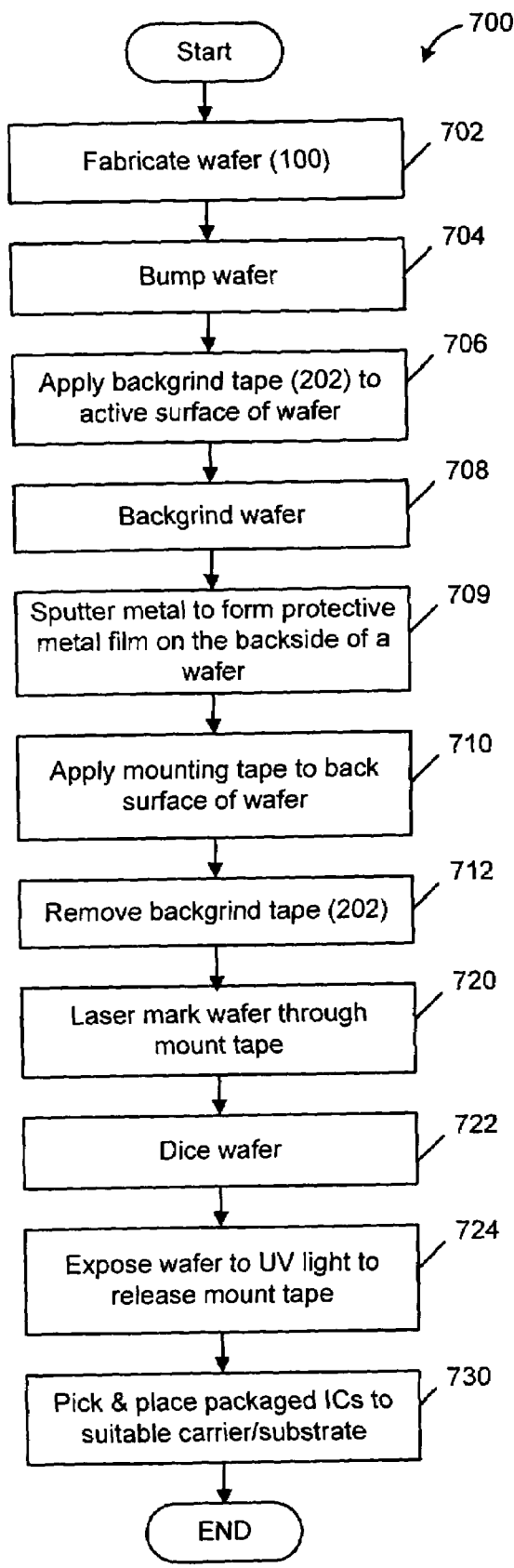
FIG. 7 is a process flow diagram illustrating a method of packaging a die that facilitates marking the back surface of a wafer in accordance with another embodiment of the present invention.

Referring next to FIG. 7, yet another embodiment of the invention will be described. In some of the previous described embodiments, it was pointed out that the back surface of the wafer (e.g., the backcoat layer) can be laser marked through the mount tape. The principle of laser marking through a mount tape can be extended beyond embodiments where a backcoat layer is applied through the use of a backcoat/mount tape as well. For example, plain back surfaces, metalized back surfaces or backcoatings applied using other techniques can all also be marked through a clear mount tape. By way of example, FIG. 7 illustrates a method of laser marking the back surface of a wafer. In this embodiment, the wafer is laser marked through a clear mount tape that does not include a backcoat layer. In this embodiment, the packaging process flow may continue in a manner similar to the process described above with respect to FIG. 4. However, in this embodiment, the back surface of the wafer is metalized (after any desired backgrinding) as illustrated in step 709. By way of example, the back surface may be metalized by sputtering a metal film such as titanium on the back surface of the wafer. The metallization is performed prior to the application of the mount tape (710).

Marking a wafer through the mount tape is particular advantageous in thin wafers. As will be appreciated by those familiar with the art, some current designs call for thinning the wafers to thicknesses on the order of as little as 2 mils for unbumped wafers or 5 mils for bumped wafers and it is expected that thinning wafers to thicknesses of less than approximately 1 mil will become more common in the near future. The handling of such thin and delicate wafers becomes a significant problem. Therefore, it can be very helpful if various post thinning operation can be accomplished while the wafer is supported by a mount tape. Marking the back surface of a wafer through the mount tape allows the wafer to be better supported during the handling required to mark the wafer.

Although marking the wafer through a clear mount layer (in multiple layer mount tapes) or a clear mount tape (in single layer tapes) is generally preferred, it should be appreciated that in other embodiments, the laser may actually burn the mounting layer/tape (or portions thereof) during the marking process. That is, even if the mounting layer/tape is not substantially transparent to the laser, marking may still be done at the wafer level by burning through (or charring or partially burning through) the mount tape without defeating the functionality of the mount tape. This is largely because typically only small portions of each die are marked and thus even if the region of the mounting tape that is marked loses its adhesiveness, the mount tape still can securely hold the wafer in place.

It should be appreciated that non-pigment based laser marks are generally made by burning or charring or otherwise causing a transformation of the surface to be marked. In embodiments that incorporate a backcoat layer in the mount tape, the mark is made by burning or charring the backcoat layer in a manner that leaves a noticeable mark. In other embodiments a different surface is burnt or charred to leave noticeable mark.

Although only a few embodiments of the invention have been described in detail, it should be appreciated that the invention may be implemented in many other forms without departing from the spirit or scope of the invention. These representative embodiments described above are provided to aid in the understanding of the invention. It should be apparent to those skilled in the art that the present invention may be practiced without some or all of these specific details. In other instances, well known process operations have not been described in detail in order to avoid unnecessarily obscuring the present invention.

For example, in the primary described embodiments, the backcoat layer 206 is formed from a curable material. However, this is not a requirement. Rather, the backcoat layer could be formed from a thermosetting resin or any other suitable adhesive material that adheres well to the back surface of a wafer. In some embodiments, it may be desirable to use a B-stageable adhesive as the backcoat layer so that the adhesive can be partially cured prior to the dicing operation and finally cured during the mounting layer releasing operation (e.g. UV exposure). Although the primary described embodiments contemplate the use of a UV releasable mounting layer, it should be appreciated that thermal or chemical releasing mechanisms could be used as well.

In another aspect of the invention, various methods of marking the back surface of a wafer with a mount tape in place have been described. These include incorporating a pigment releasable material into the mount tape and laser marking through the mount tape. Although these embodiments have been described primarily in the context of marking wafers having a protective coating on their back surface, the marking can also be readily used to mark the back surface of a bare wafer. The marking may be done on metalized back surfaces, polymeric coatings or any other coating applied at the wafer stage.

In the discussions of the embodiments illustrated in FIGS. 3, 4, 6 and 7, specific ordering of the steps have been described. However, it should be apparent that in many situations, several of the steps (e.g., bumping, backgrinding, laser marking, etc.) are entirely optional and that several other steps (e.g., sorting, testing, applying underfill or solder ball support layers to the active surface of the wafer, etc.) may be added without departing from the invention. Additionally, it should be apparent that the order of many of the steps may be varied. Therefore, the present embodiments are to be considered as illustrative and not restrictive and the invention is not to be limited to the details given herein, but may be modified within the scope and equivalents of the appended claims.

The invention claimed is:

1. A wafer level method of marking back surfaces of integrated circuit devices, the method comprising:
   providing a wafer having a plurality of flip chip style integrated circuit devices, the wafer having an active surface and a back surface, the active surface having a plurality of electrically conductive pads;
   applying a mount tape to the back surface of the wafer, the mount tape being arranged to support the wafer and including a optically opaque backcoat layer, a pigment layer and a mount layer;
   curing the backcoat layer such that the backcoat layer is affixed to the back surface of the wafer and such that the backcoat layer covers the entire back surface of each of the integrated circuit devices;
   exposing selected portions of the mount tape to light at a frequency that releases pigments from the pigment layer to thereby mark the backcoat layer to thereby mark the back surface of the integrated circuit devices;
   dicing the wafer to define a multiplicity of singulated flip chip style integrated circuits dice supported by the mount tape; and separating the singulated integrated circuits dice from the mount tape while leaving the backcoat layer affixed to the back surfaces of the integrated circuit dice, whereby the cured backcoat layer forms an optically opaque protective coating that covers the entire back surface of each integrated circuit device and is suitable for preventing light from striking the back surface of the integrated circuit device and the pigments that mark the backcoat layer include markings desired for the integrated circuit device.

2. A method as recited in claim 1 wherein the backcoat layer is formed from a polymeric material.

3. A method as recited in claim 1 wherein the mount tape utilizes a UV releasable adhesive that is optimized to most efficiently release under exposure to a frequency of light that is different than the frequency used to release pigments from the pigment layer.

4. A method as recited in claim 1 further comprising positioning a mask or reticle over the mount tape and wherein the light used to release the pigments is exposed through the mask or reticle to selectively mark selected portions of the back surface of the wafer.

5. wafer level method of marking back surfaces of integrated circuit devices, the method comprising:
   providing a wafer having a plurality of integrated circuit devices, the wafer having an active surface and a back surface, the active surface having a plurality of electrically conductive pads;
   applying a mount tape to the back surface of the wafer, the mount tape being arranged to support the wafer and including a pigment layer and a UV releasable adhesive, the pigment layer being arranged such that exposure to light at a designated frequency causes release of pigments from the pigment layer, and the UV releasable adhesive being optimized to most efficiently release under exposure to a frequency of light that is different than the frequency used to releases pigments from the pigment layer;
   exposing selected portions of the mount tape to light at a first frequency that releases pigments from the pigment layer to thereby mark the back surface of the wafer;
   dicing the wafer to define a multiplicity of singulated flip chip style integrated circuits dice supported by the mount tape; and
   after both the pigment releasing and dicing steps are completed, exposing the mount tape to light at a second frequency different than the first frequency in order to release the UV releasable adhesive.

6. A method as recited in claim 5 further comprising sputtering a metal film on the back sure of the wafer to form a protective metal film on the back surface of the wafer and wherein the pigment marks the protective metal film.

7. A method as recited in claim 5 wherein the pigment directly marks a semiconductor material.

* * * * *

UNITED STATES PATENT AND TRADEMARK OFFICE
CERTIFICATE OF CORRECTION

| | |
|---|---|
| PATENT NO. | : 7,015,064 B1 |
| APPLICATION NO. | : 10/830818 |
| DATED | : March 21, 2006 |
| INVENTOR(S) | : Patwardhan et al. |

It is certified that error appears in the above-identified patent and that said Letters Patent is hereby corrected as shown below:

In the Specification:

Column 3, line 42, delete "all ready" after "has".

In the Claims:

In line 2 of claim 6 (column 12, line 22) change "back sure" to --back surface--.

Signed and Sealed this

Fifth Day of December, 2006

JON W. DUDAS
*Director of the United States Patent and Trademark Office*